United States Patent [19]

Mueller

[11] Patent Number: 4,746,959

[45] Date of Patent: May 24, 1988

[54] ONE-TRANSISTOR MEMORY CELL FOR LARGE SCALE INTEGRATION DYNAMIC SEMICONDUCTOR MEMORIES AND THE METHOD OF MANUFACTURE THEREOF

[75] Inventor: Wolfgang Mueller, Putzbrunn, Fed. Rep. of Germany

[73] Assignee: Siemens Aktiengesellschaft, Berlin & Munich, Fed. Rep. of Germany

[21] Appl. No.: 691,393

[22] Filed: Jan. 14, 1985

[30] Foreign Application Priority Data

Apr. 25, 1984 [DE] Fed. Rep. of Germany ....... 3415455

[51] Int. Cl.⁴ ..................... H01L 29/78; H01L 29/04; G11C 11/34
[52] U.S. Cl. ........................................ 357/23.6; 357/4; 357/59; 365/182; 365/186
[58] Field of Search .......................... 357/23.6, 59 E, 4; 365/182, 186

[56] References Cited

U.S. PATENT DOCUMENTS 4,536,785 8/1985 Gibbons ............................. 357/23.6

FOREIGN PATENT DOCUMENTS 0088451 9/1983 European Pat. Off. ........... 357/23.6
0108390 5/1984 European Pat. Off. ........... 357/23.6
0167764 1/1986 European Pat. Off. ........... 357/23.6
59-19366 6/1984 Japan ................................. 357/23.6

OTHER PUBLICATIONS

Sturm et al., *IEEE Elec. Dev. Lttrs.* vol. EDL-5, No. 5, May 1984, "A Three-Dimensional ... Polysilicon", pp. 151-153.

Kamins, T. I., "MOS Transistors in Beam Re-Crystallized Polysilicon", IEDM 82, pp. 420-423.

Jolly et al., "A New Dynamic RAM Cell in Recrystallized Polysilicon", IDEM 82, pp. 803-805.

Lee et al., "Thin Film MOSFET's Fabricated in Laser-Annealed Polycrystalline Silicon", Appl. Phys. Lett., Jul. 15, 1979, vol. 35, No. 2, pp. 173-175.

Benevit et al., "A 256K Dynamic Random Access Memory", J. of Solid State Circuits, Oct. 1982, vol. SC-17, No. 5, pp. 857-861.

*Primary Examiner*—Andrew J. James
*Assistant Examiner*—Jerome Jackson
*Attorney, Agent, or Firm*—Hill, Van Santen, Steadman & Simpson

[57] ABSTRACT

A one-transistor memory cell comprises a semiconductor body which has a thin insulating layer on a boundary surface and a conductive layer on the thin insulating layer, the conductive layer representing that electrode of a storage capacitor that is connected to a selection field effect transistor. The selection field effect transistor is realized in a layer applied as a polycrystalline semiconductor layer and is then recrystallized. The memory cell provides the smallest possible semiconductor surface. This is achieved in that the recrystallized semiconductor layer is disposed above the conductive layer 3 and is separated therefrom by an intermediate insulating layer, whereby it extends in the lateral direction, at most, up to the edge of the semiconductor layer 3.

1 Claim, 2 Drawing Sheets

ONE-TRANSISTOR MEMORY CELL FOR LARGE SCALE INTEGRATION DYNAMIC SEMICONDUCTOR MEMORIES AND THE METHOD OF MANUFACTURE THEREOF

BACKGROUND OF THE INVENTION

1. Field of the Invention

The present invention relates to a one-transistor memory cell for large scale integration (LSI) dynamic semiconductor memories comprising a field effect transistor connected to a bit line and having a gate selectable via a selection line and comprising a storage capacitor, whereby a semiconductor body is provided with a first, thin insulating layer at one of its boundary surfaces and with a conductive layer applied to the first, thin insulating layer, whereby the latter, conductive layer represents an electrode of the storage capacitor and is connected to the field effect transistor, whereas that region of the semiconductor body covered by the conductive layer forms the other electrode of the storage capacitor, and whereby the field effect transistor is realized in a semiconductor layer applied as a polycrystalline semiconductor layer and then recrystallized, and to the method of manufacture of such a memory cell.

2. Description of the Prior Art

A memory cell of the type generally set forth above is known, for example, from the publication IEDM 1982, Technical Digest, pp. 420-423, particularly FIG. 7 and pp. 803-805, particularly FIG. 1. Given is memory cell, the conductive layer is composed of a semiconductor layer which is applied as a polycrystalline semiconductor layer and then recrystallized, whereby both the field effect transistor driveable via a selection line, as well as the first electrode of the storage capacitor connected thereto are formed of two mutually-adjacent subsections of this layer. The region of the semiconductor body covered by this electrode represents a first cooperating electrode of the storage capacitor; whereas a second cooperating electrode is formed by another conductive layer that lies above the first electrode of the storage capacitor and is separated therefrom by a thin insulating layer. The surface requirement of this memory cell, however, is relatively high because of the field effect transistor lying next to the storage capacitor in the lateral direction.

SUMMARY OF THE INVENTION

The object of the present invention is to provide a memory cell of the type initially set forth which has a significantly lower surface requirement and therefore enables a high packing density of the semiconductor memory.

The above object is achieved in a memory cell of the type set forth above and, according to the present invention, is characterized in that the recrystallized semiconductor layer lies above the conductive layer and is separated therefrom by a first intermediate insulating layer, in that the recrystallized semiconductor layer extends in the lateral direction, at most, up to the edge of the conductive layer, and in that the gate of the field effect transistor lies above the recrystallized semiconductor layer and is separated therefrom by a second, thin insulating layer.

The advantage which may be attained in practicing the present invention is that the surface requirement of the memory cell is determined only by the dimensions of the capacitor electrode as a result of the disposition of the recrystallized semiconductor layer above the electrode of the storage capacitor which is formed by the conductive layer. The surface efficiency of the memory cell, which can be defined as the semiconductor surface required for the storage capacitor relative to the semiconductor surface of the overall memory cell, however, is thereby significantly greater than given traditional one-transistor memory cells.

BRIEF DESCRIPTION OF THE DRAWINGS

Other objects, features and advantages of the invention, its organization, construction and mode of operation will be best understood from the following detailed description, taken in conjnction with the accompanying drawings, on which.

DESCRIPTION OF THE PREFERRED EMBODIMENTS

Figure 1:
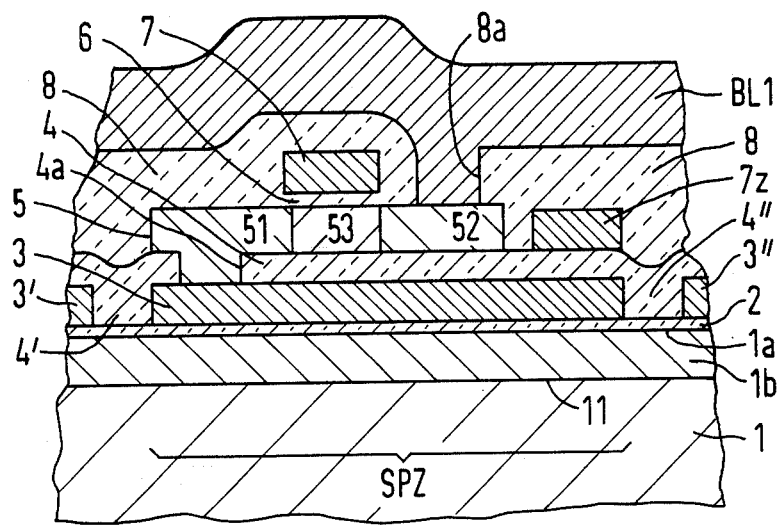
FIG. 1 is a cross-sectional view of a one-transistor memory cell constructed in accordance with the present invention, as viewed along the parting line I—I of FIG. 2.
Figure 2:
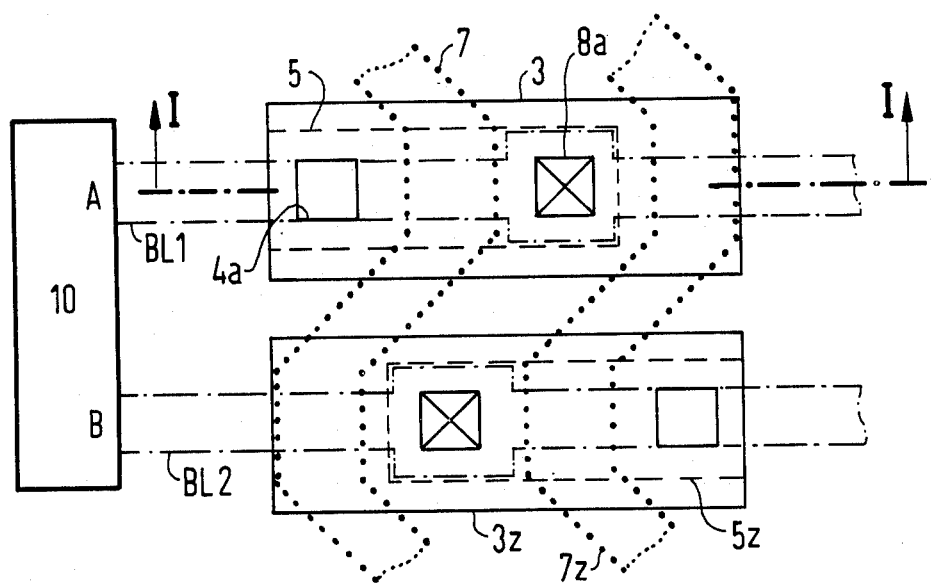
FIG. 2 is a plan view of the design of a memory cell constructed in accordance with the invention.

FIGS. 1 and 2 illustrate a one-transistor memory cell comprising a semiconductor body 1 of a predetermined conductivity type consisting, for example of p-conductive silicon having a boron doping concentration of about $10^{15}$ cm$^{-3}$ whose boundary surface 1a is provided with a thin insulating layer 2 of, for example, $SiO_2$. A conductive layer 3 which is preferably composed of polycrystalline silicon is applied to the insulating layer 2. A semiconductor layer 5 which contacts the conductive layer 3 via a contact window 4a in an intermediate insulating layer 4 is disposed on the intermediate insulating layer 4 which covers the layer 3. The semiconductor layer 5 is thereby composed of a polycrystalline silicon layer which has been recrystallized after application, for example by way of laser irradiation. It comprises n+-doped regions 51 and 52 between which a p-doped region 53 is located. A gate 7 is disposed above the region 53, being separated therefrom by a thin insulating layer 6. An interconnection BL1 of, for example, aluminum which contacts the region 52 via a contact window 8a in a layer 8 is located on the intermediate insulating layer 8 which covers the semiconductor layer 5 and the gate 7.

The regions 51 and 52 represent the source and drain regions of an n-channel field effect transistor whose channel region comprised by the region 53 is covered by the gate 7. The gate 7 is thereby connected to a drive line, for example a word line, or itself can be interpreted as a section of such a drive line. The interconnection BL1 contacting the region 52 then forms the data or bit line of a semiconductor memory, whereas the conductive layer 3 signifies the first electrode of a storage capacitor connected to the region 51, and a cooperating electrode of the storage capacitor consisting of the region SPZ of the semiconductor body 1 located below the conductive layer 3. Since the semiconductor region 5 is to be dimensioned in the lateral direction such that it, at most, extends up to the edge of the conductive layer 3, the region SPZ defines not only that surface portion on the boundary surface 1a of the semiconductor body that is required for the storage capacitor, but simultaneously defines the surface portion for the entire one-transistor memory cell which comprises the storage capacitor 3, 2, SPZ and the field effect transistor 51, 52, 53, 6, 7.

The p-doped semiconductor body 1 comprises an n+-doped zone 1b extending from the boundary surface 1a, the zone 1b extending above 0.1–0.3 μm into the semiconductor body. It is doped, for example, with arsenic, whereby the doping concentration amounts to about $10^{19}$–$10^{20}$ cm$^{-3}$. This high doping concentration leads to the fact that the electrode of the storage capacitor that is formed by the surface of the semiconductor region SPZ is a low-resistance region which can be quickly charged and discharged. The pn-junction 11 between the body 1 and the region 1b thereby prevents disturbances due to undesired chargings of the semiconductor body 1 which can occur, for example, given irradiation with alpha particles.

Deviating from the above, the semiconductor body 1 can also be n-doped, whereby the n+-doped zone 1b is again provided at its boundary surface 1a.

The upper portion of FIG. 2 illustrates the memory cell of FIG. 1, whereby the lateral limit of the conductive layer 3 is indicated with a solid line, whereas the limits of the semiconductor layer 5, of the interconnection BL1 and of the gate 7, which thereby forms a subsection of a selection line, are respectively shown as a broken line, a dot-dash line and dotted lines. The contact windows 4a and 8a are indicated by squares, whereby the contact window 8a located above the layer 5 is additionally emphasized by diagonal lines in its square. The illustration of the memory cell of FIG. 1 corresponds, as mentioned above, to a section taken along the parting line I—I of FIG. 2.

The one-transistor memory cell described up to this point, whose lateral limit is defined by the edge of the conductive layer 3, is now expanded into a memory field of a dynamic semiconductor memory by way of a multitude of identically-designed memory cells which are likewise integrated on the semiconductor body 1. The immediately-neighboring memory cells of FIG. 1 are indicated by conductive layers 3' and 3" which correspond to the conductive layer 3 of the described cell. The conductive layers 3, 3' and 3" are thereby approached so close to one another as is technologically possible in the manufacture of the memory field in order to achieve a high packing density of the memory cells. A mutual insulation is provided by the elements 4' and 4" of the intermediate insulating layer 4 which extend up to the boundary surface 1a.

FIG. 2 illustrates how the memory cells of a memory field, which lie at a convoluted bit line BL1, BL2, can be combined in respective pairs in order to achieve as high as possible a packing density. Proceeding from the two nodes A and B of a read and regenerate circuit 10, designed as a flip-flop, the two bit line halves BL1 and BL2 thereby extend in the same direction, towards the right in the illustrated example. The memory cell 3, 5 that has already been described thereby represents the first cell of such a pair, whereas an identically-constructed memory cell having the lateral limits 3z and 5z forms the second cell thereof. The latter is rotated by 180° relative to the former, whereby its recrystallized semiconductor layer 5z is offset relative to the layer 5 of the first cell to such a degree in the longitudinal direction of the bit line BL2 that the selection line 7 of the first cell extends above the conductive layer 3z but laterally next to the recrystallized semiconductor layer 5z of the second cell. The selection line 7z of the second cell is then disposed in an analogous manner such that it extends above the conductive layer 3, but laterally next to the recrystallized semiconductor 5 of the first cell. The selection line 7z of the second cell is shown in cross-section in FIG. 1.

Figure 3:
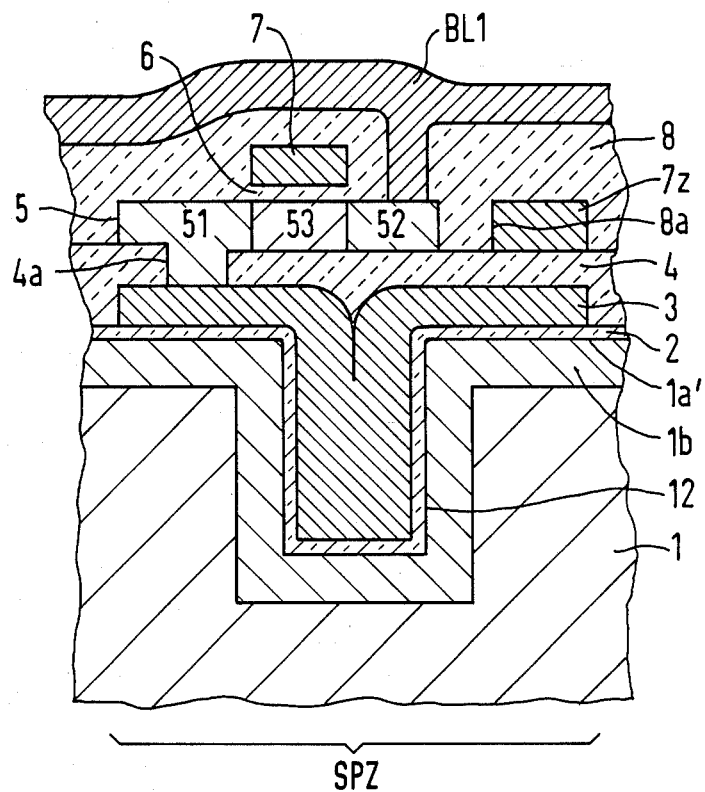
FIG. 3 is a cross-sectional view of another one-transistor memory cell constructed in accordance with the present invention.

Referring to FIG. 3, a memory cell constructed in accordance with the present invention is illustrated as comprising a semiconductor body 1 which includes a trench-like recess 12 in a region SPZ, whereby the course of the insulating layer 2 and of the conductive layer 3 follows the cloven boundary surface 1a' of the semiconductor body 1. The remaining elements of this structure correspond in structure and function to those elements of FIG. 1 provided with the same reference characters. As a result of the trench-like recess 12, the capacitance of the storage capacitor is significantly increased given the same semiconductor region SPZ or, given the same capacitance, the region SPZ required therefore is considerably dimensioned. Such a measure is already known in traditional memory cells, for example from the publication IDEM 1982, Technical Digest pp. 806–808.

In accordance with preferred features of the invention, the gate or the selection line 7 can be composed of polycrystalline silicon, of silicide or of two sub-layers which are formed of polycrystalline silicon and silicide. The formation of a selection line from such a double layer is likewise known per se, for example from the publication IEEE Journal of Solid-State Circuits, SC-17, No. 5, October 1982, pp. 857–861, with particular reference to FIG. 4.

When the transistor 51, 52, 53, 6, 7 is switched into its conductive condition during operation by the application of a positive voltage to the selection line 7, then an information voltage supplied via the bit line BL1 which corresponds to a logical "1" or to a logical "0" is applied to the storage electrode 3, whereby the storage capacitor which has it cooperating electrode connected to a reference potential via a terminal (not shown) of the zone 1b is correspondingly charged. This information is then stored after the transistor has been inhibited by disconnecting the positive voltage at the selection line 7. Given readout of the stored information, the transistor is again switched on via the gate 7, whereby the potential of the bit line BL1 which has thereby been disconnected from external potentials, i.e. is situated in a "floating" condition, changes as a result of the connection of the information-dependently charged storage capacitor dependent on the charging condition thereof. The resultant potential on the bit line BL1 is then interpreted by the connected read and regenerate circuit 10 in a manner known per se, is amplified and either read or rewritten into the addressed memory cell as a regenerated signal during the conductive condition of the transistor 51, 52, 53, 6, 7.

In addition to the n-channel execution of the one-transistor memory cell of the invention that has been described up to now, a p-channel execution is also of interest, the individual semiconductor parts being thereby replaced by those of the opposite conductivity type and the voltage is required for operation being replaced by voltages of opposite polarity.

In the manufacture of an n-channel memory cell 3, 5, 7 of the present invention, one preferably proceeds on the basis of a silicon semiconductor body 1 having a boron concentration of $10^{15}$ cm$^{-3}$ as its basic doping.

An n+-doped semiconductor zone having a penetration depth 0.1–0.3 μm is generated at the boundary surface 1a thereof, the semiconductor zone having an arsenic concentration of $10^{19}$–$10^{20}$ cm$^{-3}$. Subsequently, an insulating layer 2 of SiO$_2$ is grown to a thickness of about 10 nm, for example by thermal oxidation. Deposited on the latter is a layer of polycrystalline silicon which is provided with an n+-doping of about $10^{20}$ cm$^{-3}$ and which is structured by way of known photolithographic and etching steps, particularly according to an ion etching method, into the conductive layer 3, which represents the one electrode of the storage capacitor. This followed by the application of an intermediate insulating layer 4, for example in the form of an oxide, which can be deposited from the vapor phase (CVD oxide). A contact window 4a is then provided in the intermediate layer 4 above the element 3 by way of a photolithographic and etching step. A polycrystalline silicon layer 5 is then deposited on the layer 4 and is recrystallized in a known manner by irradiation with a laser or electron beam. Such a recrystallization operation is known, for example, from the publication IDEM 1982, Technical Digest, pp. 420–423 and from the publication Applied Physics Letters, Vol. 35, 1979, pp. 173–175. This is followed by a structuring of the recrystallized layer 5 into the regions 51, 52 and 53 by way of a photographic and etching step. The regions 51, 52 and 53 structured to this degree are then p-doped, for example by an implantation of boron ions.

In a following step, an insulating layer of, for example, SiO$_2$ having a thickness of about 25 nm is grown on the regions 51–53, a layer of polycrystalline silicon or of a silicide being then applied thereto and structured as a gate or, respectively, as a selection line 7. This layer can also advantageously be formed of two sub-layers of which the lower sub-layer is composed of polycrystalline silicon and the upper layer is composed of silicide. Given a memory structure for a convoluted bit line executed in accordance with FIG. 2, a further gate or, respectively, a further selection line 7z which represents the gate or, respectively, the selection line for the neighboring memory cell 3z, 5z is provided simultaneously with the gate or selection line 7 of the memory cell 3, 5. This is followed by an n+-doping of the source and, respectively, drain regions 51, 52 of the field effect transistor by ion implantation of arsenic ions, whereby the gate 7 serves as a doping mask. A doping concentration of about $10^{17}$ cm$^{-3}$ thereby arises in the regions 51 and 52.

Further, an intermediate insulating layer 8 of oxide is deposited, a contact window 8a being provided therein in accordance with photolithographic and etching techniques. Finally, an interconnection BL1, composed, in particular, of aluminum is deposited, this then contacting the region 52 in the region of the contact window 8a.

For a memory cell of the type illustrated in FIG. 3, the semiconductor body is provided with a trench-like recess 12 before the n+-doped zone 1b is generated, and this can preferably occur by way of an etching step.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A semiconductor memory comprising:
a plurality of one-transistor memory cells including a shared doped semiconductor body which comprises a boundary surface;
each of said one-transistor memory cells comprising:
a first insulating layer carried on said boundary surface;
a conductive layer carried on said first insulating layer and constituting a first electrode of a storage capacitor and a section of said semiconductor body forming a second electrode of the storage capacitor connected to a reference potential;
a second insulating layer carried on said conductive layer;
a recrystallized semiconductor layer, including spaced first and second regions constituting source and drain zones, carried on said second insulating layer with said first region extending through said second insulating layer and connected to said conductive layer, said recrystallized semiconductor layer extending laterally, at most, to the edge of said conductive layer;
a third insulating layer carried on said recrystallized semiconductor layer;
a gate carried above the space between said first and second regions on said third insulating layer;
said semiconductor body comprising a zone extending inwardly from said boundary surface and highly doped with respective said semiconductor body to provide rapid charging and discharging of said storage capacitor;
said zone being doped with an impurity having a conductivity opposite that of said doped semiconductor body;
a fourth insulating layer carried by said gate and said semiconductor layer;
a bit line carried by said fourth insulating layer above said gate and extending there through and connected to said second region;
said plurality of memory cells being disposed in pairs with said recrystallized semiconductor layers thereof offset relative to one another in the direction of the appertaining bit lines, said bit lines being folded for each pair of cells and extending parallel to one another; and
each of said gates constituting a portion of the selection line extending above its respective conductive layer of the respective cell and laterally of the recrystallized layer of the other cell.

* * * * *